United States Patent [19]

Wolfe

[11] Patent Number: 4,864,454

[45] Date of Patent: Sep. 5, 1989

[54] MEANS FOR REDUCING DAMAGE TO JFETS FROM ELECTROSTATIC DISCHARGE EVENTS

[75] Inventor: Edward L. Wolfe, Lawrence, Mass.

[73] Assignee: Analog Devices, Incorporated, Norwood, Mass.

[21] Appl. No.: 184,287

[22] Filed: Apr. 21, 1988

[51] Int. Cl.[4] .............................................. H01H 3/10
[52] U.S. Cl. ..................... 361/111; 361/56; 361/58; 361/91; 330/207 P; 330/298; 357/23.13
[58] Field of Search ................... 361/56, 91, 110, 111, 361/58; 357/23.13; 330/207 P, 298; 307/574, 581

[56] References Cited

U.S. PATENT DOCUMENTS 4,704,654 11/1987 Aberle et al. ..................... 361/91 X
4,739,578 5/1988 Ferrori et al. .................... 361/91 X Primary Examiner—Derek S. Jennings
Attorney, Agent, or Firm—Parmelee, Bollinger & Bramblett

[57] ABSTRACT

Differentially-connected pairs of JFETs on an IC chip are protected from ESD events by connecting respective discharge control resistors to the drains of the JFETs in such a manner as to be in series with any flow of current through either JFET.

6 Claims, 2 Drawing Sheets

MEANS FOR REDUCING DAMAGE TO JFETS FROM ELECTROSTATIC DISCHARGE EVENTS

BACKGROUND OF THE INVENTION

1. Field of the Invention

This invention relates to JFET integrated circuits (ICs) comprising a substrate carrying JFETs together with other circuit elements. More particularly, this invention relates to such ICs having means to reduce damage to the JFETs from the effects of electrostatic discharge (ESD).

2. Prior Art

It is well known that ICs are subject to serious damage or destruction as a result of Electrostatic Discharge (ESD) events. The electrostatic voltage associated with the discharge can be developed by any of many sources, including lightning, or friction between insulating bodies such as synthetic fiber clothing. Damage occurs when the ESD voltage is accidentally coupled to one of the circuit terminals and thence to some portion of the metal interconnect layer of the IC.

The metal interconnect is typically an Aluminum layer laid down over an oxide coating overlying the top surface of the semiconductor. The ESD voltage can cause a current to flow from the metal through various potential paths where the current flow can cause damage. For example, the voltage can be sufficient to break down the oxide coating to allow current to flow through to the underlying semiconductor. Still other paths are available for current flow. The current ultimately leaves the IC through some other circuit terminal. The magnitude of the current is often sufficient to cause significant damage, e.g. by leaving an oxide coating permanently conducting, and the resulting shunt path causing circuit failure.

Various techniques have been developed to prevent damage from ESD events. For Example, the sensitivity to ESD events in ICs can be reduced by altering the position of the metal interconnect, by changing the layout of the impurity depositions, or widening resistors. Also, separate protection networks have been employed in some cases.

JFETs are especially sensitive to damage from ESD events. The problem of JFET sensitivity to ESD events cannot be solved by known techniques such as by rearranging layouts and the like, and protection networks are unsatisfactory because they degrade JFET performance excessively. Accordingly, protecting JFETs from ESD events has represented a serious problem. It is the purpose of this invention to solve that problem.

SUMMARY OF THE INVENTION

In a preferred embodiment of the invention, to be described hereinbelow in detail, differentially-connected pairs of JFETs on an IC chip are protected from ESD events by connecting respective discharge control resistors to the drains of the JFETs in such a manner as to be in series with any flow of current through either JFET. The resistors advantageously generate a substantial voltage drop, in response to flow of ESD current, so as to assure that any breakdown will occur across the gate-to-isolation junction. By diverting the ESD current to that junction, the charge from the ESD event can be safely dissipated without damaging the sensitive gate-to-source/drain junctions. ESD protection can in some cases be increased by this technique to nearly 2000 volts.

Other objects, aspects and advantages of the invention will in part be pointed out in, and in part apparent from, the following description of a preferred embodiment of the invention, considered together with the accompanying drawings.

DETAILED DESCRIPTION OF A PREFERRED EMBODIMENT

Figure 1:
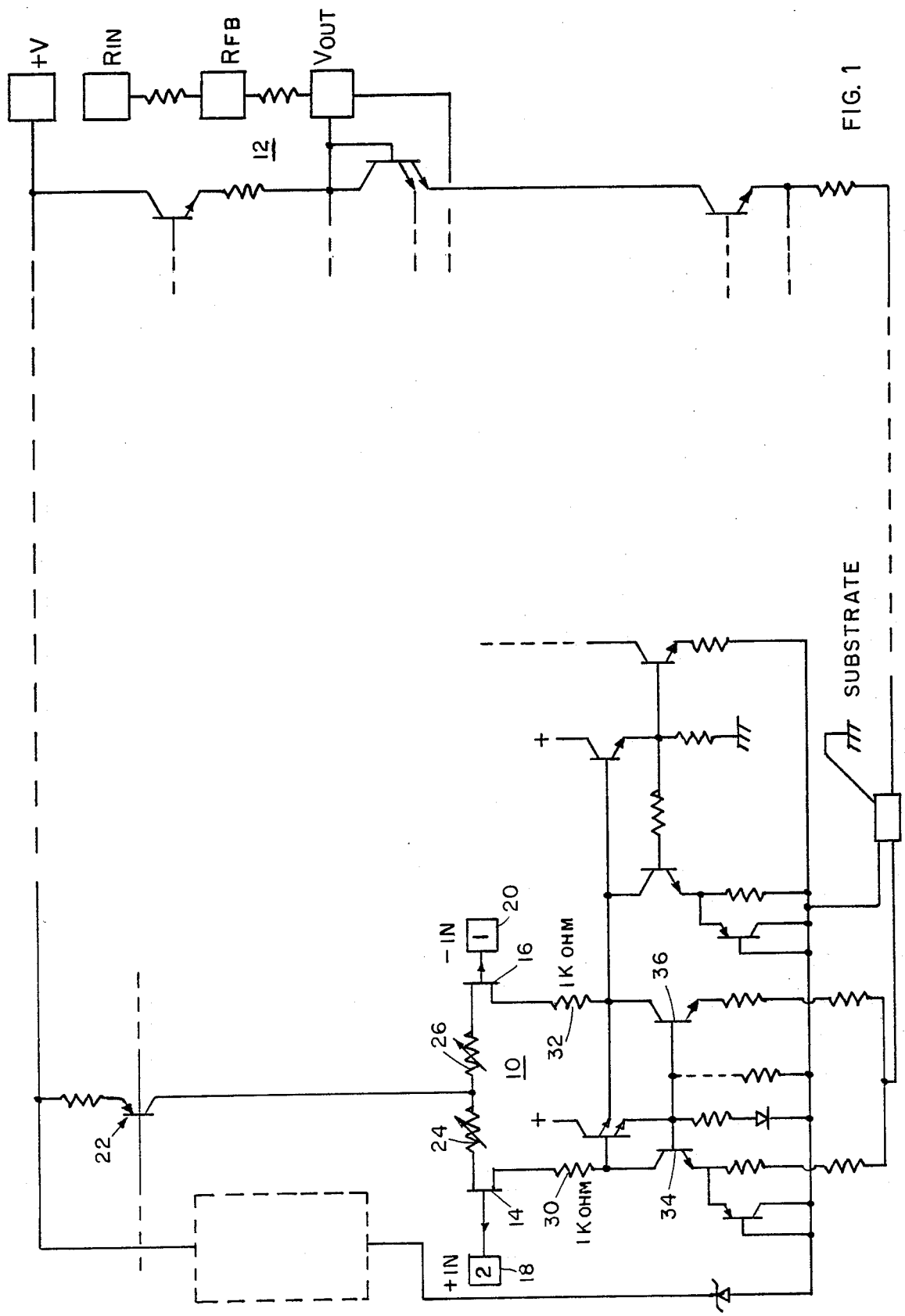
FIG. 1 is a schematic circuit diagram of a preferred embodiment of the invention.

Referring now to FIG. 1, there are shown portions of the circuit of an amplifier of generally known basic design. The amplifier portions shown comprise the input circuitry 10 and the output circuitry 12. The various circuit elements between the input and output circuitry are not pertinent to the present invention, and therefore are not shown in the drawing in order to simplify the presentation.

The input circuitry 10 includes the usual differentially-connected pair of JFETs 14, 16 with their gates connected respectively to corresponding input terminals 18, 20. Operating current is supplied by a transistor 22 the collector of which is connected through trimmable bias resistors 24, 26 to the sources of the input JFETs. Additional information on JFET input circuitry may be found in various references, for example U.S. Pat. No. 4,639,683.

The drains of the input JFETs 14, 16 are connected through respective discharge control resistors 30, 32 to the collectors of a pair of transistors 34, 36. These transistors are arranged as an active load for the input JFETs, and provide a single-ended output signal suitable for further processing by the remainder of the amplifier circuitry.

The control resistors 30, 32 perform a critical function of the present invention. In more detail, if an ESD event occurs and applies a positive voltage to the gate of either of the JFETs, there will be some resulting current flow from the gate, through the drain, through the corresponding control resistor 30, 32, and on to the substrate (the potential of which typically is two diode drops below the gate potential). This current flow through either control resistor develops a proportional voltage across the resistor, thereby correspondingly raising the potential (relative to the substrate) of the JFET elements connected to the upper terminal of the resistor, including both the front gate and the back gate.

Figure 2:
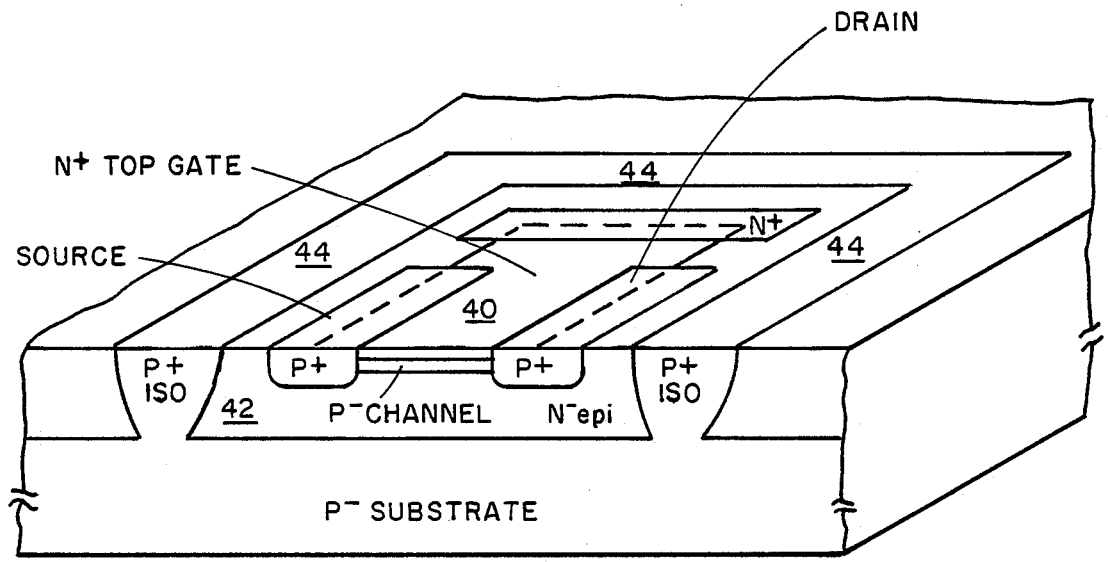
FIG. 2 is a perspective view of a typical P-channel JFET in an IC chip.

FIG. 2 is a cutaway view illustrating somewhat schematically the arrangement of a typical P-channel JFET. This view shows the front gate (or "top" gate) 40 and the back gate 42 (the N− epi) which ordinarily are connected together. It will be seen that the back gate forms a junction of relatively large area with the isolation ("iso") regions 44 alongside of the JFET.

By appropriately selecting the ohmic value of the control resistors 30, 32, flow of ESD current through either resistor will raise the potential of both gates of that JFET and ultimately divert the ESD current to the junction between the back gate 42 and the isolation region 44 of the IC chip. This dissipate the remaining charge developed by the ESD event. Although this current flow through the junction may be quite large in absolute terms, it will not be likely to cause damage because the current density will be relatively low due to the large area of the junction.

Experimentation with control resistors 30, 32 of different ohmic values has led to the conclusion that for most JFET amplifier designs, resistors of about 1K ohm are best. This is sufficiently large to provide good ESD protection, yet not large enough to reduce common mode input range by a deleterious amount. Typically the control resistors will be developed as thin film resistors, directly on the IC chip. ESD protection can be raised to nearly 2000 volts by this technique.

Although a preferred embodiment of the invention has been described herein in detail, this has been for the purpose of illustrating the principles of the invention, and should not necessarily be construed as limiting the invention since it is apparent that those skilled in the art can make many modified arrangements of the invention without departing from the true scope thereof.

What is claimed is:

1. An IC amplifier having a pair of differentially-connected JFETs each with source, drain and gate electrodes, wherein the improvement comprises means for reducing susceptibility to ESD damage including:

first and second control resistors coupled to the drains of said JFETs respectively and in series with current flowing from the gate to the drain and thence to the substrate of the IC, thereby to raise the potential of the corresponding drain during an ESD event and to tend to divert the ESD current to the gate-to-iso junction to dissipate the ESD charge through that junction.

2. An IC amplifier as in claim 1, wherein said control resistors are connected directly to the respective JFET drains.

3. An IC amplifier as in claim 1, including transistor means connected to the ends of said control resistors remote from said JFET drains to serve as an active load for said JFETs.

4. An IC amplifier as in claim 3, wherein said transistor means comprises a pair of transistors each having a collector; and means connecting said collectors respectively to said remote ends of said resistors.

5. The method of minimizing damage to either one of a differential pair of JFETs forming part of an IC amplifier, wherein said JFETs each includes source, drain and gate electrodes, and wherein the damage to be protected against results from the flow of ESD charge current from the gate to the drain of either JFET; said method including the steps of:

flowing the ESD charge current from the gate-to-drain junction of the affected JFET and thence through current control resistor means connected to the drain of that JFET, the current flowing from the resistor to the substrate of the IC, thereby to raise the potential of the corresponding JFET gate relative to the IC substrate during an ESD event so as to exceed the gate-to-iso breakdown voltage and thereby allow excess ESD charge current to be dissipated through the gate-to-iso path.

6. The method of claim 5, wherein the JFET drain currents are directed to the input electrodes respectively of an active load.

* * * * *